(12) United States Patent
Sakai et al.

(10) Patent No.: US 7,776,766 B2
(45) Date of Patent: Aug. 17, 2010

(54) TRENCH FILLING METHOD

(75) Inventors: Tatsuya Sakai, Chuo-ku (JP); Yasuo Matsuki, Chuo-ku (JP)

(73) Assignee: JSR Corporation, Tokyo (JP)

( * ) Notice: Subject to any disclaimer, the term of this patent is extended or adjusted under 35 U.S.C. 154(b) by 314 days.

(21) Appl. No.: 11/814,256

(22) PCT Filed: Jan. 11, 2006

(86) PCT No.: PCT/JP2006/300565

§ 371 (c)(1),
(2), (4) Date: Jul. 18, 2007

(87) PCT Pub. No.: WO2006/077840

PCT Pub. Date: Jul. 27, 2006

(65) Prior Publication Data

US 2008/0194118 A1 Aug. 14, 2008

(30) Foreign Application Priority Data

Jan. 19, 2005 (JP) ............... 2005-011690

(51) Int. Cl.
*H01L 21/31* (2006.01)
*H01L 21/469* (2006.01)
(52) U.S. Cl. .............. 438/785; 257/E21.174; 257/E21.24
(58) Field of Classification Search .......... 438/785; 257/E21.174, E21.24
See application file for complete search history.

(56) References Cited

U.S. PATENT DOCUMENTS

| 6,143,357 | A | 11/2000 | Shin et al. |
| 6,228,764 | B1 | 5/2001 | Hwang |
| 2003/0224152 | A1 | 12/2003 | Yokoyama et al. |
| 2004/0192038 | A1 | 9/2004 | Yokoyama et al. |

FOREIGN PATENT DOCUMENTS

| CN | 1461779 | 12/2003 |
| EP | 0 952 156 A2 | 10/1999 |
| EP | 1 462 544 A2 | 9/2004 |
| JP | 6-349833 | 12/1994 |
| JP | 9-045773 | 2/1997 |
| JP | 9 45773 | 2/1997 |

(Continued)

OTHER PUBLICATIONS

J. K. Ruff, et al., "The Journal of the American Chemical Society", vol. 82, 1960, pp. 2139-2144.

(Continued)

*Primary Examiner*—W. David Coleman
*Assistant Examiner*—Sonya D McCall-Shepard
(74) *Attorney, Agent, or Firm*—Oblon, Spivak, McClelland, Maier & Neustadt, L.L.P.

(57) ABSTRACT

A trench embedding method comprising the steps of
  applying a composition for filling trenches which comprises a complex of an amine compound and aluminum hydride and an organic solvent to a substrate having trenches; and
  heating and/or exposing the composition to light to convert the complex into aluminum in the trenches so as to embed aluminum into the trenches.

According to this method, even when aluminum is embedded into trenches having a fine and complex pattern, embedding performance is high and trenches in a large substrate can filled. This method can be carried out at a low cost.

10 Claims, 1 Drawing Sheet

FOREIGN PATENT DOCUMENTS

| | | |
|---|---|---|
| JP | 10-125780 | 5/1998 |
| JP | 10 125780 | 5/1998 |
| JP | 11-195652 | 7/1999 |
| JP | 2000-026474 | 1/2000 |
| JP | 2000 26474 | 1/2000 |
| JP | 2004-006197 | 1/2004 |
| JP | 2004 6197 | 1/2004 |
| JP | 2004-303783 | 10/2004 |
| JP | 2004 303783 | 10/2004 |
| SG | 83121 | 9/2001 |
| TW | 562800 | 11/2003 |

OTHER PUBLICATIONS

G. W. Fraser, et al., "The Journal of the Chemical Society", 1963, pp. 3742-3749.

Jerry L. Atwood, et al., "The Journal of the American Chemical Society", vol. 113, 1991, pp. 8183-8185.

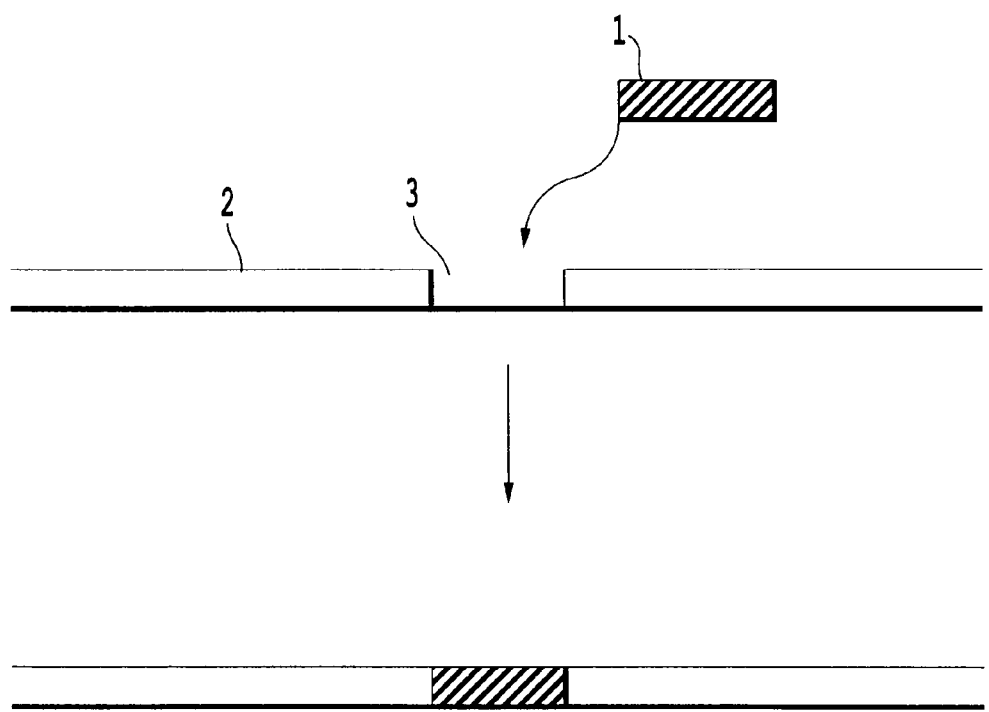

TRENCH FILLING METHOD

TECHNICAL FIELD

The present invention relates to a trench embedding method. More specifically, it relates to a trench embedding method which is useful for the formation of fine and complex wires by embedding aluminum into trenches formed in a substrate.

BACKGROUND ART

In recent years, the structures of wires or electrodes in electronic devices such as DRAM (Dynamic Random Access Memory) have been becoming finer and more complex to achieve higher performance, and the improvement of shape accuracy for these electronic devices has been desired.

To form electrodes or wires in the electronic devices, in general, trenches are formed at positions corresponding to the electrodes or wires on the substrate, a metal material which will become the electrodes or wires is embedded into the trenches, and an excessive portion is removed by chemical mechanical polishing or the like.

Heretofore, aluminum having high conductivity has been widely used as an electrode material or wire material to be embedded into the trenches. When aluminum is used as the material, physical processes such as deposition and sputtering have been mainly used to fill the trenches (refer to JP-A 6-349833 and JP-A 11-195652). However, to embed aluminum into the trenches, according to a conventionally known embedding method, when the minimum distance of the opening on the surface of a trench is about 300 nm or less and the aspect ratio (value obtained by dividing the depth of the trench by the minimum distance of the opening on the surface of the trench) of the trench is about 3 or more, a void where aluminum is not embedded may be formed in the trench Therefore, there are limits in meeting demand for the fine and complex structures of wires and electrodes.

In addition, the above physical processes need a high vacuum apparatus and a high-output power source, thereby causing such problems that it is difficult to apply the processes to large substrates and the process cost is high.

DISCLOSURE OF THE INVENTION

It is an object of the present invention which has been made in view of the above situation to provide a trench embedding method which has high embedding performance even when aluminum is embedded into trenches having a fine and complex pattern, can be easily applied to large substrates and can be carried out at a low cost.

According to the present invention, the above object of the present invention can be attained by a trench embedding method comprising the steps of:

applying a composition for filling trenches comprising a complex of an amine compound and aluminum hydride and an organic solvent to a substrate having trenches; and heating and/or exposing the composition to light to convert the above complex into aluminum in the trenches so as to embed aluminum into the trenches.

BRIEF DESCRIPTION OF THE DRAWING

FIGURE schematically depicts embedding the composition of amine compound, aluminum hydride and organic solvent (shaded box) in a trench of a substrate.

BEST MODE FOR CARRYING OUT THE INVENTION

The composition for filling trenches used in the method of the present invention contains a complex of an amine compound and aluminum hydride and an organic solvent.

Aluminum hydride (often called "alan") contained in the above complex of an amine compound and aluminum hydride is a compound composed of aluminum and hydrogen atoms and generally represented by $AlH_3$.

The complex of an amine compound and aluminum hydride contained in the composition for filling trenches used in the method of the present invention can be synthesized in accordance with methods described in J. K. Ruff et al., J. Amer. Chem. Soc., vol. 82, p. 2141, 1960, G. W. Fraser et al., J. Chem. Soc., p. 3742, 1963 and J. L. Atwood et al., J. Amer. Chem. Soc., vol. 113, p. 8183, 1991.

The complex of an amine compound and aluminum hydride contained in the composition for filling trenches used in the method of the present invention can be synthesized by adding a hydrochloric acid salt of an amine compound to a diethyl ether suspension of lithium aluminum hydride and reacting them under agitation at room temperature in an $N_2$ gas. The reaction temperature and the reaction solvent should be suitably selected according to the desired type of the complex of an amine compound and aluminum hydride.

The amine compound used in the present invention may be a monoamine compound or a polyamine compound. Examples of the polyamine compound include diamine compounds, triamine compounds and tetramine compounds.

Examples of the above monoamine compound include monoamine compounds represented by the following formula (1) and other monoamine compounds.

$$R^1R^2R^3N \quad (1)$$

($R^1$, $R^2$ and $R^3$ are each independently a hydrogen atom, alkyl group, alkenyl group, alkynyl group, aryl group or aralkyl group.)

The alkyl group, alkenyl group or alkynyl group represented by $R^1$, $R^2$ and $R^3$ in the formula (1) may be linear, cyclic or branched.

The above alkyl group is, for example, an alkyl group having 1 to 12 carbon atoms such as methyl group, ethyl group, propyl group, cyclopropyl group, butyl group, pentyl group, hexyl group, heptyl group, octyl group, nonyl group, decyl group, undecyl group, dodecyl group, cyclohexyl group, 2-methylbutyl group or 2-ethylhexyl group.

The above alkenyl group is, for example, an alkenyl group having an unsaturated group such as vinyl group, allyl group, crotyl group or ethynyl group.

The above alkynyl group is, for example, a phenylethynyl group.

The above aryl group is, for example, a phenyl group.

The above aralkyl group is, for example, a benzyl group.

The above compounds represented by the above formula (1) include ammonia, trimethylamine, triethylamine, tri-n-propylamine, tri-isopropylamine, tricyclopropylamine, tri-n-butylamine, triisobutylamine, tri-t-butylamine, tri-2-methylbutylamine, tri-n-hexylamine, tricyclohexylamine, tri(2-ethylhexyl)amine, trioctylamine, triphenylamine, tribenzylamine, dimethylphenylamine, diethylphenylamine, diisobutylphenylamine, methyldiphenylamine, ethyldiphenylamine, isobutyldiphenylamine, dimethylamine, diethylamine, di-n-propylamine, diisopropylamine, dicyclopropylamine, di-n-butylamine, diisobutylamine, di-t-butylamine, methylethylamine, methylbutylamine, di-n-hexylamine, dicyclohexylamine, di(2-ethylhexyl)amine, dioctylamine, diphenylamine, dibenzylamine, methylphenylamine, ethylphenylamine, isobutylphenylamine, methylallylamine, methylvinylamine, methyl(phenylethynyl)amine, phenyl (phenylethynylamine), methylamine, ethylamine, n-propylamine, isopropylamine, cyclopropylamine, n-butylamine, isobutylamine, t-butylamine, 2-methylbutylamine, n-hexylamine, cyclohexylamine, 2-ethylhexylamine, octylamine, phenylamine and benzylamine.

The monoamine compounds other than the monoamine compounds represented by the above formula (1) include 1-aza-bicyclo[2.2.1]heptane, 1-aza-bicyclo[2.2.2]octane (quinuclidine), 1-aza-cyclohexane, 1-aza-cyclohexan-3-ene and N-methyl-1-aza-cyclohexan-3-ene.

The above diamine compounds include ethylenediamine, N,N'-dimethylethylenediamine, N,N'-diethylethylenediamine, N,N'-diisopropylethylenediamine, N,N'-di-t-butylethylenediamine, N,N'-diphenylethylenediamine, N,N,N',N'-tetramethylethylenediamine, N,N,N',N'-tetraethylethylenediamine and phenylenediamine.

The above triamine compounds include diethylenetriamine, 1,7-dimethyl-1,4,7-triazaheptane, 1,7-diethyl-1,4,7-triazaheptane and N,N',N''-trimethyl-1,3,5-triazacyclohexane.

The above tetramine compounds include trimethylenetetramine and triethylenetetramine. These amine compounds may be used alone or in combination of two or more.

Out of these amine compounds, monoamine compounds represented by the above formula (1) are preferably used. Trimethylamine, triethylamine, triisopropylamine, triisobutylamine, tri-t-butylamine, dimethylamine, diethylamine, diisopropylamine, diisobutylamine, di-t-butylamine, methylethylamine, methylbutylamine, methylphenylamine, ethylphenylamine, isobutylphenylamine, methylamine, ethylamine, isopropylamine, cyclopropylamine, n-butylamine, isobutylamine, t-butylamine, 2-methylbutylamine, n-hexylamine or phenylamine is more preferably used. Trimethylamine, triethylamine, tri-isopropylamine, triisobutylamine or tri-t-butylamine is particularly preferably used.

These amine compounds may be used alone or in combination of two or more.

The organic solvent contained in the composition for filling trenches used in the method of the present invention is not particularly limited if it dissolves the above complex of the amine compound and aluminum hydride and optional additives which will be described hereinafter and does not react with these. It is, for example, a hydrocarbon solvent, ether solvent or other polar solvent.

Example of the above hydrocarbon solvent include n-pentane, cyclopentane, n-hexane, cyclohexane, n-heptane, cycloheptane, n-octane, cyclooctane, decane, cyclodecane, dicyclopentadiene hydride, benzene, toluene, xylene, durene, indene, tetrahydronaphthalene, decahydronaphthalene and squalane.

Examples of the above ether solvent include diethyl ether, dipropyl ether, dibutyl ether, ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, tetrahydrofuran, tetrahydropyran, bis(2-methoxyethyl)ether, p-dioxane, anisole, 2-methylanisole, 3-methylanisole, 4-methylanisole, phentol, 2-methylphentol, 3-methylphentol, 4-methylphentol, veratrol, 2-ethoxyanisole and 1,4-dimethoxybenzene.

Examples of the above polar solvent include methylene chloride and chloroform.

The above organic solvents may be used alone or in combination of two or more.

Out of these, a hydrocarbon solvent or a mixed solvent of a hydrocarbon solvent and an ether solvent is preferably used from the viewpoints of solubility and the stability of the formed solution. n-pentane, cyclopentane, n-hexane, cyclohexane, n-heptane, cycloheptane, n-octane, benzene, toluene or xylene is preferably used as the hydrocarbon solvent. Diethyl ether, dipropyl ether, dibutyl ether, ethylene glycol diethyl ether, ethylene glycol methyl ethyl ether, tetrahydrofuran, tetrahydropyran, anisole, 2-methylanisole, 3-methylanisole, 4-methylanisole, phentol, veratrol, 2-ethoxyanisole or 1,4-dimethoxybenzene is preferably used as the ether solvent.

The composition for filling trenches used in the method of the present invention contains the above complex of the amine compound and aluminum hydride and the above organic solvent as essential components and may optionally contain a titanium compound or an aluminum compound (excluding a complex of an amine compound and aluminum hydride).

Examples of the above titanium compound include compounds represented by the following formulas (2) to (6)

$$Ti(OR^4)_4 \qquad (2)$$

wherein $R^4$ is an alkyl group having 1 to 10 carbon atoms, phenyl group, halogenated alkyl group or halogenated phenyl group.

$$Ti(OR^4)_x L_{4-x} \qquad (3)$$

wherein $R^4$ is as defined in the above formula (2), L is a group represented by the following formula,

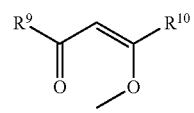

($R^9$ and $R^{10}$ are the same or different and each an alkyl group having 1 to 10 carbon atoms, phenyl group, alkoxy group, halogenated alkyl group or halogenated phenyl group), and x is an integer of 0 to 3.

$$Ti(OR^6)_y(X)_{4-y} \qquad (4)$$

wherein $R^6$ is an alkyl group or phenyl group, X is a halogen atom, and y is an integer of 0 to 3.

$$Ti(NR^7)_4 \qquad (5)$$

wherein $R^7$ is an alkyl group or phenyl group.

$$Ti(Cp)_n(Y)_{4-n} \qquad (6)$$

wherein Cp is a cyclopentadienyl group, Y is a halogen atom or alkyl group, and n is an integer of 1 to 4.

In the above formulas (2) and (3), $R^4$ is preferably methyl group, ethyl group, n-propyl group, i-propyl group, n-butyl group, t-butyl group, methoxy group, ethoxy group, n-propoxy group, i-propoxy group, n-butoxy group, t-butoxy group, hexyl group, cyclohexyl group, phenoxy group, methylphenoxy group or trifluoromethyl group, more preferably methyl group, ethyl group, n-propyl group, i-propyl group, n-butyl group, t-butyl group, hexyl group, cyclohexyl group or phenyl group. In the above formula (3), $R^9$ and $R^{10}$ are each preferably methyl group, ethyl group, n-propyl group, i-propyl group, n-butyl group, t-butyl group, methoxy group, ethoxy group, n-propoxy group, i-propoxy group, n-butoxy group, t-butoxy group, phenoxy group, methylphenoxy group or trifluoromethyl group. They are each particularly preferably methyl group, ethyl group, i-propyl group, t-butyl group, methoxy group, ethoxy group, i-propoxy group, t-butoxy group or trifluoromethyl group.

Examples of the titanium compound represented by the above formula (2) include titanium methoxide, titanium ethoxide, titanium-n-propoxide, titanium-n-nonyl oxide, titanium stearyl oxide, titanium isopropoxide, titanium-n-butoxide, titanium isobutoxide, titanium-t-butoxide, titanium trimethylsiloxide, titanim-2-ethyl hexoxide, titanium methoxypropoxide, titanium phenoxide, titanium methylphenoxide, titanium fluoromethoxide and titanium chlorophenoxide.

Examples of the titanium compound represented by the above formula (3) include tetrakis(penta-2,4-diketo)titanium, tetrakis(2,2,6,6-tetramethylhepta-3,5-diketo)titanium, tetrakis(l-ethoxybutane-1,3-diketo)titanium, tetrakis(1,1,1,5,5,5-hexafluoropenta-2,4-diketo)titanium, (2,2-dimethylhexa-3,5-diketo)titanium, bis(penta-2,4-diketo)titanium dimethoxide, bis(2,2,6,6-tetramethylhepta-3,5-diketo)titanium dimethoxide, bis(1-ethoxybutane-1,3-diketo)titanium dimethoxide, bis(1,1,1,5,5,5-hexafluoropenta-2,4-diketo)titanium dimethoxide, (2,2-dimethylhexa-3,5-diketo)titanium dimethoxide, bis(penta-2,4-diketo)titanium i-propoxide, bis (2,2,6,6-teramethylhepta-3,5-diketo)titanium i-propoxide, bis(1-ethoxybutane-1,3-diketo)titanium di-i-propoxide, bis (1,1,1,5,5,5-hexafluoropenta-2,4-diketo)titanium di-i-propoxide and (2,2-dimethylhexa-3,5-diketo)titanium di-i-propoxide.

Examples of the titanium compound represented by the above formula (4) include trimethoxytitanium chloride, triethoxytitanium chloride, tri-n-propoxytitanium chloride, tri-i-propoxytitanium chloride, tri-n-butoxytitanium chloride, tri-t-butoxytitanium chloride, triisostearoyltitanium chloride, dimethoxytitanium dichloride, diethoxytitanium dichloride, di-n-propoxytitanium dichloride, di-i-propoxytitanium dichloride, di-n-butoxytitanium dichloride, di-t-butoxytitanium dichloride, diisostearoyltitanium dichloride, methoxytitanium trichloride, ethoxytitanium trichloride, n-propoxytitanium trichloride, i-propoxytitanium trichloride, n-butoxytitanium trichloride, t-butoxytitanium trichloride, isostearoyltitanium trichloride and titanium tetrachloride.

Examples of the titanium compound represented by the above formula (5) include tetrakis(dimethylamino)titanium, tetrakis(diethylamino)titanium, tetrakis(di-t-butoxyamino) titanium, tetrakis(di-i-propoxyamino)titanium and tetrakis (diphenylamino)titanium.

Examples of the titanium compound represented by the above formula (6) include dicyclopentadienyltitanium dichloride, dicyclopentadienyltitanium dibromide, cyclopentadienyltitanium trichloride, cyclopentadienyltitanium tribromide, dicyclopentadienyl dimethyltitanium, dicyclopentadienyl diethyltitanium, dicyclopentadienyl di-t-butyltitanium, dicyclopentadienyl phenyltitanium chloride and dicyclopentadienyl methyltitanium chloride.

Examples of the above aluminum compound (excluding a complex of an amine compound and an aluminum hydride compound) include trimethylaluminum, triethylaluminum, tri-n-propylaluminum, tricyclopropylaluminum, tri-n-butylaluminum, triisobutylaluminum, tri-t-butylaluminum, tri-2-methylbutylaluminum, tri-n-hexylaluminum, tricyclohexylaluminum, tri(2-ethylhexyl)aluminum, trioctylaluminum, triphenylaluminum, tribenzylaluminum, dimethylphenylaluminum, diethylphenylaluminum, diisobutylphenylaluminum, methyldiphenylaluminum, ethyldiphenylaluminum, isobutyldiphenylaluminum, diethylaluminum hydride, diisobutylaluminum hydride, diphenylaluminum hydride, dimethyl methacrylaluminum, dimethyl(phenylethynyl)aluminum, diphenyl(phenylethynyl)aluminum, dimethylamine dimethylaluminum complex, diethylamine•diethylaluminum complex, dimethylamine•diethylaluminum complex, diethylamine•dimethylaluminum complex, diphenylamine•dimethylaluminum complex and diphenylamine•diethylaluminum complex.

The amount of the complex of the amine compound and the aluminum hydride compound contained in the composition for filling trenches used in the method of the present invention is preferably 60 mass % or less, more preferably 8 to 50 mass % based on the entire composition. This value is preferably changed by the opening width of the trench to be filled. For example, when the opening width of the trench is smaller than 100 nm, the amount of the complex of the amine compound and the aluminum hydride compound contained in the composition for filling trenches is preferably 8 mass % or more and less than 20 mass %, more preferably 8 to 15 mass %. When the opening width of the trench is 100 to 300 nm, the amount of the complex of the amine compound and the aluminum hydride compound containing in the composition for filling trenches is preferably 20 to 50 mass %, more preferably 20 to 40 mass %.

When the composition for filling trenches used in the method of the present invention contains a titanium compound, the amount of the titanium compound is preferably 1 mol % or less, more preferably 0.00001 to 1 mol %, much more preferably 0.00005 to 0.01 mol % based on the total of the amine compound, the aluminum hydride compound and the titanium compound. When the amount of the titanium compound falls within this range, high embedding performance and the stability of the composition can be both obtained.

When the composition for filling trenches used in the method of the present invention contains an aluminum compound (excluding a complex of an amine compound and an aluminum hydride compound), the amount of the aluminum compound is preferably 5 mass % or less, more preferably 1 mass % or less, much more preferably 0.1 mass % or less based on the entire composition. When the amount of the aluminum compound falls within this range, high-purity aluminum can be embedded into the trenches.

The ratio of the mass excluding the solvent of the composition for filling trenches to the total mass of the composition (to be referred to "nonvolatile content" hereinafter) is desirably changed by the opening width of the trench to be filled. For example, when the opening width of the trench is smaller than 100 nm, the nonvolatile content of the composition for filling trenches is preferably 8 mass % or more and less than 20 mass %, more preferably 8 to 15 mass %. When the opening width of the trench is 100 to 300 nm, the nonvolatile content of the composition for filling trenches is preferably 20 to 50 mass %, more preferably 20 to 40 mass %.

The process of manufacturing the composition for filling trenches used in the method of the present invention is not particularly limited. For example, after the complex of the amine compound and the aluminum hydride compound is synthesized in the presence of a solvent as described above, a solution from which an undissolved product such as a by-product has been removed with a filter or the like may be used as the composition for filling trenches directly. Or, after a desired solvent is added to this solution, the solvent used for the reaction, for example, diethyl ether is removed under reduced pressure to obtain the composition for filling trenches.

When the composition for filling trenches used in the method of the present invention contains a titanium compound and/or an aluminum compound (excluding a complex of an amine compound and an aluminum hydride compound), it can be prepared by adding a solution containing a predetermined amount of a titanium-containing compound and/or an aluminum compound (excluding a complex of an amine compound and an aluminum hydride compound) to a solution containing a complex of an amine compound and an aluminum hydride compound prepared as described above under agitation. The temperature for adding the above solution is preferably 0 to 150° C., more preferably 5 to 100° C. The stirring time is preferably 0.1 to 120 minutes, more preferably 0.2 to 60 minutes. By mixing them together under the above conditions, a stable composition having high embedding performance can be obtained.

The trench embedding method of the present invention comprises the steps of applying the above composition for filling trenches to a substrate having trenches and heating and/or exposing the composition to light to convert the above complex into aluminum in the trenches so as to embed aluminum into the trenches.

The material constituting the above substrate is preferably an insulator.

Examples of the above insulating film include a thermally oxidized film, PETEOS film (Plasma Enhanced-TEOS film), HDP film (High Density Plasma Enhanced-TEOS film), silicon oxide film obtained by thermal CVD, boro-phospho silicate film (BPSG film), insulating film called "FSG" and insulating film having a low dielectric constant.

The above thermally oxidized film is formed by exposing high-temperature silicon to oxidizing atmosphere to chemically react silicon with oxygen or silicon with water.

The above PETEOS film is formed from tetraethylorthosilicate (TEOS) by chemical vapor deposition making use of plasma as a promoting condition.

The above HDP film is formed from tetraethylorthosilicate (TEOS) by chemical vapor deposition making use of high-density plasma as a promoting condition.

The above silicon oxide film obtained by thermal CVD can be obtained by atmospheric pressure CVD (AP-CVD) or low-pressure CVD (LP-CVD).

The above boro-phospho silicate film (BPSG film) can be obtained by the atmospheric pressure CVD (AP-CVD) or low-pressure CVD (LP-CVD).

The above insulating film called "FSG" can be formed by chemical vapor deposition making use of high-density plasma as a promoting condition.

Examples of the above insulating film having a low dielectric constant include organic SOG, hydrogen-containing SOG, low-dielectric constant materials composed of an organic polymer, SiOF-based low-dielectric constant materials and SiOC-based low-dielectric constant materials. "SOG" stands for "Spin On Glass" and means an insulating film material formed by applying a precursor to a substrate and heating it.

The above organic SOG is made of silicon oxide containing an organic group such as methyl group and can be obtained by applying a precursor containing a mixture of tetraethoxysilane and methyltrimethoxysilane to a substrate and heating it.

The above hydrogen-containing SOG is made of silicon oxide containing a silicon-hydrogen bond and can be obtained by applying a precursor containing triethoxysilane to a substrate and heating it.

The above low-dielectric constant materials composed of an organic polymer include low-dielectric constant materials essentially composed of polyarylene, polyimide, polybenzocyclobutene or polyethylene fluoride.

The above SiOF-based low-dielectric constant materials are composed of silicon oxide containing a fluorine atom and can be obtained, for example, by adding (doping) fluorine to silicon oxide obtained by chemical vapor deposition.

The above SiOC-based low-dielectric constant materials are composed of silicon oxide containing carbon atoms and can be obtained, for example, from a mixture of silicon tetrachloride and carbon monoxide by chemical vapor deposition.

Films formed from the organic SOG, hydrogen-containing SOG and low-dielectric constant materials composed of an organic polymer out of the above materials may have pores.

The trenches to be filled by the method of the present invention are formed in the substrate made of the above material by a known method, for example, photolithography.

Although the above trenches may be of any shape or any size, when the opening width of each of the trenches, that is, the minimum distance of the opening on the surface is 300 nm or less and the aspect ratio, that is, the value obtained by dividing the depth of the trench by the minimum distance of the opening on the surface of the trench is 3 or more, the advantageous effect of the present invention is obtained to the fullest. The opening width of the trench may be 10 to 250 nm, specifically 30 to 200 nm. The aspect ratio of the trench may be 3 to 40, specifically 5 to 25.

The substrate having trenches used in the method of the present invention may be prepared by applying a solution comprising an organic metal compound containing at least one metal atom selected from the group consisting of titanium, palladium and aluminum as a base film and heating it. Use of this base film is effective in well embedding an aluminum film into the trenches.

Examples of the organic metal compound containing a titanium atom include titanium alkoxides, titanium compounds having an amino group, complexes of titanium and a β-diketone, titanium compounds having a cyclopentadienyl group and titanium compounds having a halogen group.

Examples of the organic metal compound containing a palladium atom include palladium complexes having a halogen atom, palladium acetate compounds, complexes of palladium and a β-diketone, complexes of palladium and a compound having a conjugated carbonyl group, and phosphine-based palladium complexes.

Examples of the organic metal compound containing an aluminum atom include aluminum alkoxides, aluminum alkylates and complexes of aluminum and a β-diketone, excluding complexes of an amine compound and aluminum hydride.

As for specific examples of the organic metal compounds, the organic metal compounds containing a titanium atom include titanium compounds enumerated as the titanium compound which can be contained in the above composition for filling trenches.

Out of the organic metal compounds containing a palladium atom, the palladium complexes having a halogen atom include allylpalladium chloride, dichlorobis(acetonitrile)palladium and dichlorobis(benzonitrile)palladium; the palladium acetate compounds include palladium acetate; the complexes of palladium and a β-diketone include pentane-2,4- dionatopalladium and hexafluoropentanedionatopalladium; the complexes of palladium and a compound having a conjugated carbonyl group include bis(dibenzylideneacetone)palladium; and the phosphine-based palladium complexes include bis[1,2-bis(diphenylphosphino)ethane]palladium, bis(triphenylphosphine)palladium chloride, bis(triphenylphosphine)palladium acetate, diacetate bis(triphenylphosphine)palladium, dichloro[1,2-bis(diphenylphosphine)ethane]palladium, trans-dichlorobis(tricyclohexylphosphine)palladium, trans-dichlorobis(triphenylphosphine)palladium, trans-dichlorobis(tri-o-tolylphosphine)palladium and tetrakis(triphenylphosphine)palladium.

Out of the organic metal compounds containing an aluminum atom, the aluminum alkoxides include aluminum ethoxide, aluminum isopropoxide, aluminum-n-butoxide, aluminum-s-butoxide, aluminum-t-butoxide, aluminum ethoxyethoxyethoxide and aluminum phenoxide; the aluminum alkylates include aluminum acetate, aluminum acrylate, aluminum methacrylate and aluminum cyclohexanebutylate; and the complexes of aluminum and a β-diketone include pentane-2,4-diketoaluminum, hexafluoropentane-2,4-diketoaluminum, 2,2,6,6-tetramethylheptane-3,5-diketoaluminum, bis(ethoxybutane-1,3-diketo)aluminum s-butoxide, (ethoxybutane-1,3-diketo)aluminum di-s-butoxide and (ethoxybutane-1,3-diekto)aluminum diisopropoxide.

Out of these, titanium isopropoxide, aluminum isopropoxide, bis(ethoxybutane-1,3-diketo)titanium diisopropoxide, tetra(pentane-2,4-diketo)titanium, pentane-2,4-diketopalladium, hexafluoropentane-2,4-diketopalladium, pentane-2,4-diketoaluminum and hexafluoropentane-2,4-diketoaluminum are preferred.

Any solvent may be used as the solvent used in the solution of the organic metal compound containing at least one metal atom selected from the group consisting of titanium, palladium and aluminum if it can dissolve the organic metal compound. Examples of the solvent include ethers, esters having an ether group, hydrocarbons, alcohols, aprotic polar solvents and mixed solvents thereof.

The above ethers include tetrahydrofuran, dioxane, ethylene glycol dimethyl ether, ethylene glycol diethyl ether, diethylene glycol dimethyl ether and diethylene glycol diethyl ether; the above esters having an ether group include ethylene glycol monomethyl ether acetate, ethylene glycol monoethyl ether acetate, propylene glycol monomethyl ether acetate, propylene glycol monoethyl ether acetate and 2-acetoxy-1-methoxypropane; the above hydrocarbons include toluene, xylene, hexane, cyclohexane, octane, decalin, tetralin and durene; the above alcohols include methanol, ethanol and propanol; and the above aprotic polar solvents include N-methylpyrrolidone, N,N-dimethylformamide, N,N-dimethylacetamide, hexamethylphosphoamide and γ-butyrolactone. The content of the organic metal compound in the solution of the organic metal compound is preferably 0.1 to 10 mass %, more preferably 0.1 to 5 mass %.

The solution of the organic metal compound can be applied to the substrate by spin coating, roll coating, curtain coating, dip coating, spray coating or jet coating. When the substrate has a trench structure, the opening width of each trench is 300 nm or less and the aspect ratio of the trench is 5 or more, the solution of the organic metal compound is applied to the substrate which is then left under reduced pressure for a while, thereby making it possible to apply the organic metal compound to the inside of the trench more uniformly. Stated more specifically, the substrate is kept at a pressure (to be referred to as "second pressure" hereinafter) lower than the pressure (to be referred to as "first pressure" hereinafter) for applying the solution of the organic metal compound to the trench substrate. The second pressure is preferably 1 to 70%, more preferably 10 to 40% of the first pressure. For example, when the pressure for application is $1.01 \times 10^5$ Pa (normal pressure), the second pressure is preferably $1.01 \times 10^3$ to $7.09 \times 10^4$ Pa, more preferably $1.01 \times 10^4$ to $4.05 \times 10^4$ Pa. The time during which the substrate is kept at the second pressure is preferably 10 seconds to 10 minutes, more preferably 10 seconds to 1 minute. After the substrate is kept at the second pressure, preferably, the pressure is returned to the first pressure by using an inert gas and then the substrate is heated. The series of operations for reducing pressure, keeping the substrate at the reduced pressure and returning the pressure to the first pressure may be repeated several times. The time for returning the pressure to the first pressure is preferably 3 seconds to 5 minutes, more preferably 5 seconds to 1 minute. The number of repetitions is preferably 10 or less from the viewpoints of film uniformity and work efficiency, more preferably 5 or less when priority is given to work efficiency. The base film formed as described above is further heated. The heating temperature is preferably 30 to 350° C., more preferably 40 to 300° C. The heating time is preferably 5 to 90 minutes, more preferably 10 to 60 minutes. The atmosphere during the coating step and the heating step is preferably made up of an inert gas such as nitrogen, helium or argon. These steps may be carried out in an atmosphere optionally further containing a reducing gas such as hydrogen or an oxidizing gas such as oxygen. The thickness of the base film is preferably 0.001 to 5 µm, more preferably 0.005 to 0.5 µm after the solvent is removed.

The formed coating film of the organic metal compound is then heated. The heating temperature is preferably 30 to 350° C., more preferably 40 to 300° C. The heating time is preferably 5 to 90 minutes, more preferably 10 to 60 minutes.

The atmosphere during the coating step and the heating step is preferably made up of an inert gas such as nitrogen, helium or argon. An atmosphere optionally further containing a reducing gas such as hydrogen is more preferred. A solvent and additives from which water and oxygen have been removed are desirably used.

To apply the above composition for filling trenches to the above substrate having trenches, a suitable technique such as spin coating, roll coating, curtain coating, dip coating, spray coating or jet coating may be used. In these coating techniques, coating conditions that ensure the spread of the composition for filling trenches to the corners of the inside of each trench are adopted according to the shapes and sizes of the trenches on the substrate. For example, when spin coating is employed as a coating technique and the trenches have an opening width smaller than 100 nm, the revolution of a spinner can be set to 500 to 2,500 rpm, specifically 800 to 2,000 rpm. When the trenches have an opening width of 100 to 300 nm, the revolution of the spinner can be set to 500 to 2,000 rpm, specifically 800 to 1,500 rpm.

To remove a low-boiling component such as the solvent contained in the applied composition for filling trenches after the above coating step, heating may be carried out. The heating temperature and time which differ according to the type and boiling point (vapor pressure) of the solvent in use may be 100 to 350° C. and 5 to 90 minutes, respectively. The solvent can be removed at a lower temperature by keeping the whole system under reduced pressure.

The coating film formed as described above is heated and/or exposed to light to embed aluminum into the trenches. The above heating temperature is preferably 60° C. or higher, more preferably 70 to 400° C. The heating time is preferably 30 seconds to 120 minutes, more preferably 1 to 90 minutes.

Examples of the light source used for the above exposure include a mercury lamp, deuterium lamp, rare gas discharge light, YAG laser, argon laser, carbonic acid gas laser and rare gas halogen excimer laser. Examples of the above mercury lamp include a low-pressure mercury lamp and a high-pressure mercury lamp. Examples of the rare gas used for the above rare gas discharge light include argon, krypton and xenon. Examples of the rare gas halogen used in the above rare gas halogen excimer laser include XeF, XeCl, XeBr, KrF, KrCl, ArF and ArCl.

The output of the light source is preferably 10 to 5,000 W, more preferably 100 to 1,000 W. The wavelength of the light source is not particularly limited but preferably 170 to 600 nm. Use of laser light is particularly preferred from the viewpoint of the quality of the aluminum embedded film.

Only one or both of the above heat treatment and optical treatment may be carried out. When both of them are carried out, the order of them is not limited and they may be carried out simultaneously. It is preferred to carry out only the heat treatment or both of the heat treatment and the optical treatment.

The atmosphere in which the step of applying the composition for filling trenches, the optional step of removing the solvent and the heat treatment and/or optical treatment step are carried out is preferably an inert atmosphere or a reducing atmosphere without oxygen as much as possible. The above inert atmosphere can be created with an inert gas such as nitrogen, helium or argon. The above reducing atmosphere can be created with a mixture of any one of the inert gases and a reducing gas. Examples of the reducing gas include hydrogen and ammonia. When the reducing atmosphere is adopted as the atmosphere for these steps, the ratio of the reducing gas to the total of the inert gas and the reducing gas is preferably 1 to 70 mol %, more preferably 3 to 40 mol %.

The above trench embedding method of the present invention makes it possible to embed high-quality aluminum into trenches easily even when the trenches have a small opening width and a large aspect ratio.

EXAMPLES

The following examples are provided to further illustrate the present invention. The following operation was carried out in a dry nitrogen atmosphere unless stated otherwise. The solvent used is dehydrated with a molecular sieve 4 A (of Union Showa Co., Ltd.) and deaerated by bubbling a nitrogen gas in advance.

Example 1

1. Preparation of a Composition for Filling Trenches 1-1. Preparation of a Solution Containing a Complex of an Amine Compound and Aluminum Hydride 3.80 g of lithium aluminum hydride was fed to a 200 ml three-necked flask having a magnetic stirrer therein. A 100 ml-powder adding funnel, a suction plug three-way cock connected to a nitrogen stream and a glass plug were connected to the three connection ports of the three-necked flask, respectively. After 17.80 g of a hydrochloric acid salt of triethylamine was fed to the powder adding funnel, the three-necked flask was sealed with nitrogen through the suction plug three-way cock.

100 ml of hexane was added to the above three-necked flask by a glass syringe. After the hydrochloric acid salt of triethylamine was gradually dropped into the there-necked flask over 10 minutes under agitation with the magnetic stirrer at a revolution of 1,000 rpm, stirring was further continued for 2 hours.

Thereafter, a polytetrafluoroethylene tube having an end plugged up with absorbent cotton (of Japanese Pharmacopoeia) was used to transfer the reaction mixture to another vessel by pressure and filtered with a polytetrafluoroethylene membrane filter having an opening diameter of 0.1 μm (manufactured by Whatman Inc.) The filtrate was received by a 300 ml eggplant-like flask, a magnetic stirrer was put into the flask after filtration, and a suction plug three-way cock was attached.

This suction plug three-way cock was connected to a vacuum pump through a trap to remove the solvent under reduced pressure under agitation with the magnetic stirrer at a revolution of 300 rpm. After the solvent was removed, the residue was filtered with a polytetrafluoroethylene membrane filter having an opening diameter of 0.1 μm (manufactured by Whatman Inc.) to obtain 10.25 g of a complex of triethylamine and aluminum hydride as an achromatic transparent liquid (yield of 55%).

After 0.52 g of triethylamine was added to 4.00 g of the complex of triethylamine and aluminum hydride, 4-methylanisole was added to prepare 8.00 g of a mixture as a solution containing 50 mass % of the complex of triethylamine and aluminum hydride.

1-2. Preparation of a Solution Containing a Titanium Compound 0.11 g of cyclopentadienyltitanium trichloride was fed to a 30 ml glass vessel, and 4-methylanisole was added to prepare 25.00 g of a mixture. After the mixture was fully stirred, it was left at room temperature for 4 hours and filtered with a polytetrafluoroethylene membrane filter having an opening diameter of 0.1 μm (manufactured by Whatman Inc.) to obtain a solution containing 20 μmol/g of cyclopentadienyltitanium trichloride.

1-3. Preparation of a Composition for Filling Trenches

27 μl of the solution containing 20 μmol/g of cyclopentadienyltitanium trichloride prepared in 1-2. was added to 0.50 ml of the solution containing 50 mass % of the complex of triethylamine and aluminum hydride prepared in 1-1. under agitation at room temperature and further stirred for 1 minute to prepare a composition for filling trenches.

2. Preparation of a Composition for Forming a Base Film 0.30 g of bis(penta-2,4-diketo)titanium (IV) diisopropoxide and 64 μl of tetrakis (dimethylamino) titanium were put into a 20 ml glass vessel, and 2-acetoxy-1-methoxypropane was added to prepare 18.00 g of a mixture. After this mixture was fully stirred, it was left at room temperature for 2 hours. Then, this was filtered with a polytetrafluoroethylene membrane filter having an opening diameter of 0.1 μm (manufactured by Whatman Inc.) to obtain a composition for forming a base film.

3. Filling Trenches

Example 1

A silicon oxide substrate measuring 50 mm×50 mm×0.5 mm and having a large number of linear trenches with a width of 150 nm, a depth of 450 nm and a length of 3 mm (aspect ratio=3) at intervals of 300 nm was prepared. The trenches were formed on one 50 mm×50 mm side of this substrate.

This substrate was placed on a spin coater in such a manner that the trench surface faced up, 1 ml of the composition for forming a base film prepared in 2. was added dropwise, and the substrate was spun at a revolution of 3,000 rpm for 10 seconds. This substrate was placed on a hot plate set at 150° C. to be heated for 25 minutes.

Thereafter, this substrate was placed on the spin coater again in such a manner that the trench surface faced up, the total amount of the composition for filling trenches prepared in 1. was added dropwise, and the substrate was spun at a revolution of 800 rpm for 10 seconds. When this substrate was heated on a hot plate set at 150° C. for 10 minutes and further at 250° C. for 30 minutes, the surface of the substrate was covered with a metallic film. When the ESCA spectrum of this film was observed, a peak attributed to $Al_{2p}$ was seen at 73.5 eV which proved that this film was an aluminum film.

When this substrate was cut in a direction perpendicular to the trenches to observe its section through the S-4200 scanning electron microscope (of Hitachi, Ltd.), the insides of all the trenches were filled, and high embedding performance was confirmed.

Example 2

A silicon oxide substrate measuring 50 mm×50 mm×0.5 mm and having a large number of linear trenches with a width of 150 nm, a depth of 3,000 nm and a length of 3 mm (aspect ratio=20) at intervals of 300 nm was prepared. The trenches were formed on one 50 mm×50 mm side of this substrate. This substrate was placed on a Petri dish having a diameter of 90 mm and 15 ml of a composition for forming a base film prepared in the same manner as in 2. of Example 1 was added to immerse the substrate therein. This substrate was placed in a vacuum desiccator together with the Petri dish, the pressure was reduced to $4 \times 10^4$ Pa (about 0.4 atm), the substrate was maintained at that pressure for 10 seconds, and the pressure was returned to $1.01 \times 10^5$ Pa by dry nitrogen in 3 seconds. After this vacuum treatment and dry nitrogen introduction were repeated 5 times, the substrate was taken out, placed on a spin coater in such a manner that the trench surface faced up, spun at a revolution of 3,000 rpm for 10 seconds and then heated on a hot plate set at 150° C. for 25 minutes.

Thereafter, this substrate was placed on the spin coater again in such a manner that the trench surface faced up, the total amount of a composition for filling trenches prepared in the same manner as in 1. of Example 1 was added dropwise, and the substrate was spun at a revolution of 800 rpm for 10 seconds. When this substrate was heated on a hot plate set at 150° C. for 10 minutes and further at 250° C. for 30 minutes, the surface of the substrate was covered with a metallic film. When the ESCA spectrum of this film was observed, a peak attributed to $Al_{2p}$ was seen at 73.5 eV which proved that this film was an aluminum film.

When this substrate was cut in a direction perpendicular to the trenches to observe its section through the S-4200 scanning electron microscope, the insides of all the trenches were filled and high embedding performance was confirmed.

Comparative Example 1

0.05 g of granular aluminum was set in the tungsten basket of the Surface Preparator PEC-A2 vacuum deposition apparatus (of Shimadzu Corporation), and a silicon oxide substrate having trenches similar to that used in Example 1 was set on a stage. After the inside pressure of the apparatus was reduced to $2.7 \times 10^{-5}$ Pa over 2 hours, a current of 20 A was applied to the basket while the stage was turned to melt the aluminum pellet. The current value was raised to 40 A after 30 seconds and maintained at that value for 3 minutes to evaporate all the granular aluminum. The current was cut to cool the substrate gradually for 1 minute, the revolution of the stage was stopped, and air was introduced into the apparatus to return the pressure to a normal level. The surface of the substrate was covered with a metallic film. When the ESCAP spectrum of this film was observed, a peak attributed to $Al_{2p}$ was seen at 73.5 eV which proved that this film was an aluminum film.

When this substrate was cut in a direction perpendicular to the trenches to observe its section through the S-4200 scanning electron microscope, aluminum was existent at positions close to the surface of the substrate in the trenches but a void (where aluminum was not embedded) was seen at a depth larger than 100 nm in the trenches. Therefore, it is understood that vacuum deposition was inferior in embedding performance.

As described above, according to the present invention, there is provided a trench embedding method which has high embedding performance even when aluminum is embedded into trenches having a fine and complex pattern. The trench embedding method of the present invention can be easily applied to large substrates and contributes to the curtailment of costs.

The invention claimed is:

1. A trench embedding method comprising embedding a composition in trenches of a substrate wherein the composition comprises a complex of an amine compound and aluminum hydride and an organic solvent; and heating and/or exposing the composition to light to embed aluminum into the trenches.

2. The method according to claim 1, wherein the composition further comprises a titanium compound.

3. The method according to claim 1, wherein the substrate having trenches has been coated with a composition for forming a base film which contains at least one compound, excluding a complex of an amine compound and aluminum hydride, selected from the group consisting of titanium, palladium and aluminum and heated.

4. The method according to claim 1, wherein the substrate having trenches has trenches with a value obtained by dividing the depth of each trench by the minimum distance of the opening on the surface of the trench of 3 or more.

5. The method according to claim 1, wherein the substrate having trenches has trenches with a value obtained by dividing the depth of each trench by the minimum distance of the opening on the surface of the trench of 3 to 40.

6. The method according to claim 1, wherein the substrate having trenches has trenches with a value obtained by dividing the depth of each trench by the minimum distance of the opening on the surface of the trench of 5 to 25.

7. The method according to claim 1, wherein the substrate having trenches has trenches with the minimum distance of the opening on the surface of 300 nm or less.

8. The method according to claim 1, wherein the amine compound is a monoamine compound.

9. The method according to claim 1, wherein the amine compound is a monoamine compound represented by the following formula (1):

$$R^1R^2R^3N \qquad (1)$$

wherein, $R^1$, $R^2$ and $R^3$ are each independently a hydrogen atom, alkyl group, alkenyl group, alkynyl group, aryl group or aralkyl group.

10. The method according to claim 2, wherein the titanium compound is a compound represented by each of the following formulas (2) to (6):

$$Ti(OR^4)_4 \quad (2)$$

wherein $R^4$ is an alkyl group having 1 to 10 carbon atoms, phenyl group, halogenated alkyl group or halogenated phenyl group, $$Ti(OR^4)_x L_{4-x} \quad (3)$$

wherein $R^4$ is as defined in the above formula (2), L is a group represented by the following formula,

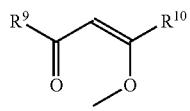

wherein $R^9$ and $R^{10}$ are the same or different and each an alkyl group having 1 to 10 carbon atoms, phenyl group, alkoxy group, halogenated alkyl group or halogenated phenyl group, and x is an integer of 0 to 3, $$Ti(OR^6)_y(X)_{4-y} \quad (4)$$

wherein $R^6$ is an alkyl group or phenyl group, X is a halogen atom, and y is an integer of 0 to 3, $$Ti(NR^7)_4 \quad (5)$$

wherein $R^7$ is an alkyl group or phenyl group.

$$Ti(Cp)_n(Y)_{4-n} \quad (6)$$

wherein Cp is a cyclopentadienyl group, Y is a halogen atom or alkyl group, and n is an integer of 1 to 4.

* * * * *